United States Patent
Hsu et al.

(10) Patent No.: US 10,267,847 B2
(45) Date of Patent: Apr. 23, 2019

(54) PROBE HEAD STRUCTURE OF PROBE CARD AND TESTING METHOD

(71) Applicant: Taiwan Semiconductor Manufacturing Company, Ltd., Hsin-Chu (TW)

(72) Inventors: Ming-Cheng Hsu, Hsin-Chu (TW); Mill-Jer Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 280 days.

(21) Appl. No.: 15/183,415

(22) Filed: Jun. 15, 2016

(65) Prior Publication Data

US 2017/0363658 A1 Dec. 21, 2017

(51) Int. Cl.
*G01R 31/20* (2006.01)
*G01R 1/067* (2006.01)
*G01R 31/28* (2006.01)

(52) U.S. Cl.
CPC .......................... *G01R 31/2889* (2013.01)

(58) Field of Classification Search
CPC ............ G01R 1/07307; G01R 1/07342; G01R 31/2863; G01R 31/2886; G01R 31/2889
See application file for complete search history.

(56) References Cited

U.S. PATENT DOCUMENTS

| | | | |
|---|---|---|---|
| 5,479,110 A * | 12/1995 | Crane | G01R 1/0433 324/754.07 |
| 5,786,701 A * | 7/1998 | Pedder | G01R 1/07314 324/756.05 |
| 2008/0309363 A1* | 12/2008 | Jeon | G01R 1/0735 324/755.07 |
| 2015/0260758 A1* | 9/2015 | Leikermoser | G01R 31/31905 324/758.04 |

* cited by examiner

Primary Examiner — Minh N Tang
(74) Attorney, Agent, or Firm — Slater Matsil, LLP

(57) ABSTRACT

A probe head and methods of testing a device using a probe head are provided. The probe head includes a first end connected to a first substrate. The first substrate is configured to be connected to a test head. The probe head also includes second end having a first inner recess surrounded by a first protrusion and a first plurality of probe needles connected to the first protrusion.

20 Claims, 10 Drawing Sheets

PROBE HEAD STRUCTURE OF PROBE CARD AND TESTING METHOD

BACKGROUND

In semiconductor integrated circuit (IC) manufacturing, wafers are tested during manufacturing and prior to shipment to ensure proper operation. Wafer testing is a testing technique where a temporary electrical connection is established between automatic test equipment (ATE) and dies formed on the wafer to demonstrate proper performance of the ICs.

Along with complexity improvement of circuit designs, rapid development of semiconductor fabrication processes, and demand for circuit performance, ICs have been developed with a three-dimensional (3D) structure to increase circuit performance. New and different test equipment is needed for these 3D structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
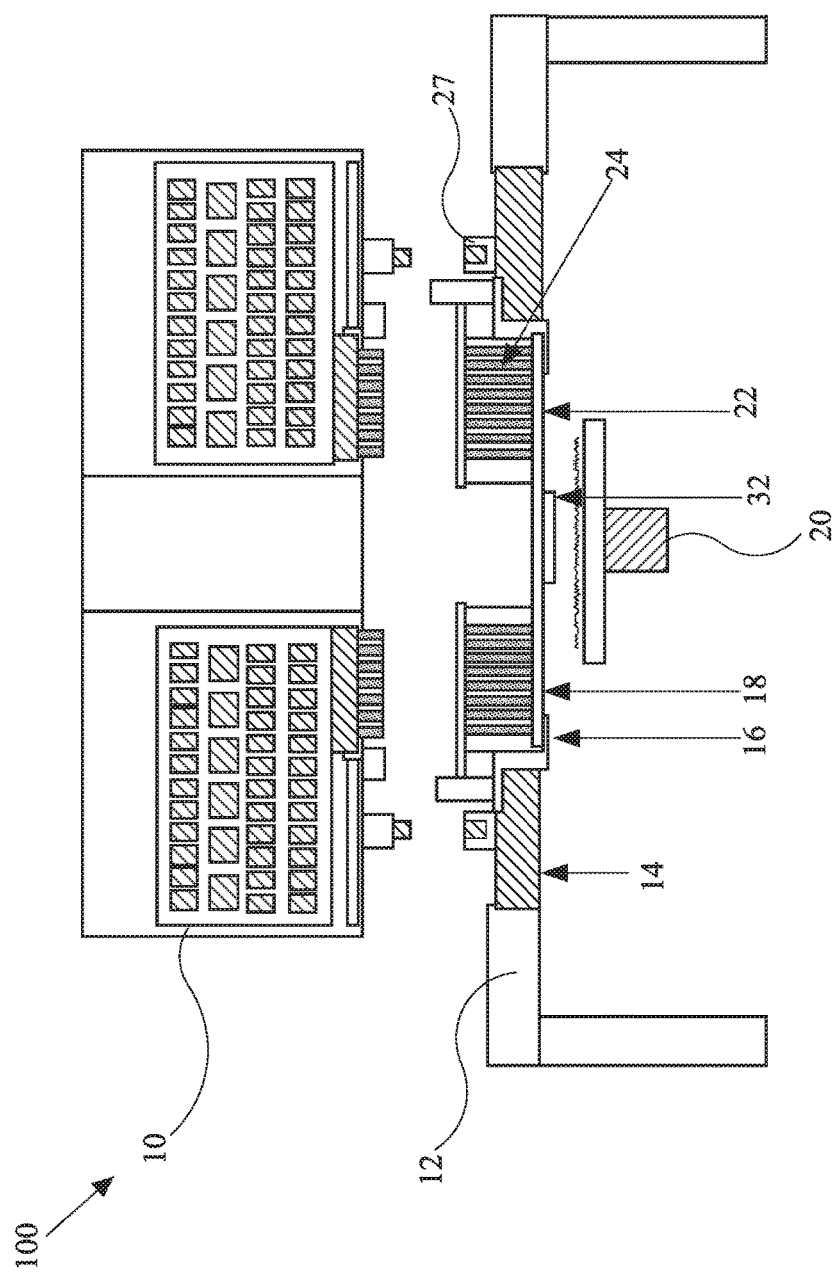
FIG. 1 is a cross sectional view of a probe testing system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments have one or a combination of the following features and/or advantages. A system for testing a wafer includes a probe head that is comprised in a probe card. The probe card is configured to be connected to a test head. The wafer being tested by the system includes a plurality of package components, with a first package component stacked over a second package component. A first end of the probe head includes a protruding surface that has a plurality of probe needles. The protruding surface is arranged around an inner recess that is sized to fit over the first package component that is stacked on the second package component. The probe head is arranged to test the second package component after the first package component is stacked on the second package component. For example, the second package component includes a plurality of contacts on an upper surface. The probe needles on the protruding surface of the probe head are arranged to each respectively touch a contact pad on the second package component to perform a test on the second package component. Because of the inner recess, the first surface probe head is able to be positioned sufficiently close to the second package component for the probe needles to touch the contacts on the second package component without damaging the first package component or the probe head.

FIG. 1 depicts a probe test system 100 that is configured to test a 3D integrated circuit package according to some example embodiments. Probe test system 100 includes a test head 10. Test head 10 may generate, or be connected to other circuitry that generates, control signals, data signals, clock signals, and/or power signals that may be transmitted to a 3D integrated circuit package being tested. In some embodiments, test head 10 may include a computer system, such as a processor that is coupled to memory and configured to perform testing of a 3D package when the processor executes instructions stored in the memory Test head 10 is configured to be brought into physical contact with prober 12 through latch point 27. Prober 12 may include a first substrate 18 that is connected to prober 12 via prober head plate 14 and insert ring 16. In some embodiments, first substrate 18 may be a printed circuit board ("PCB"). A probe head 32 is mounted on an underside of first substrate 18. Probe head 32 may have a plurality of probe needles mounted to a bottom surface (see probe needles 104 in FIG. 2). When probe needles on probe head 32 are brought into physical contact with electrical connectors on a 3D integrated circuit package (see package 200 in FIG. 2) being tested, electrical signals from test head 10 pass through probe head 32 and first substrate 18 into the package being tested to perform testing of the integrated circuit package. The integrated circuit package may be positioned on prober chuck 20. First substrate 18 is also connected to load board 24, which acts as a mechanical and electrical interface between first substrate 18 and test head 10, and may be a PCB, for example.

Figure 2:
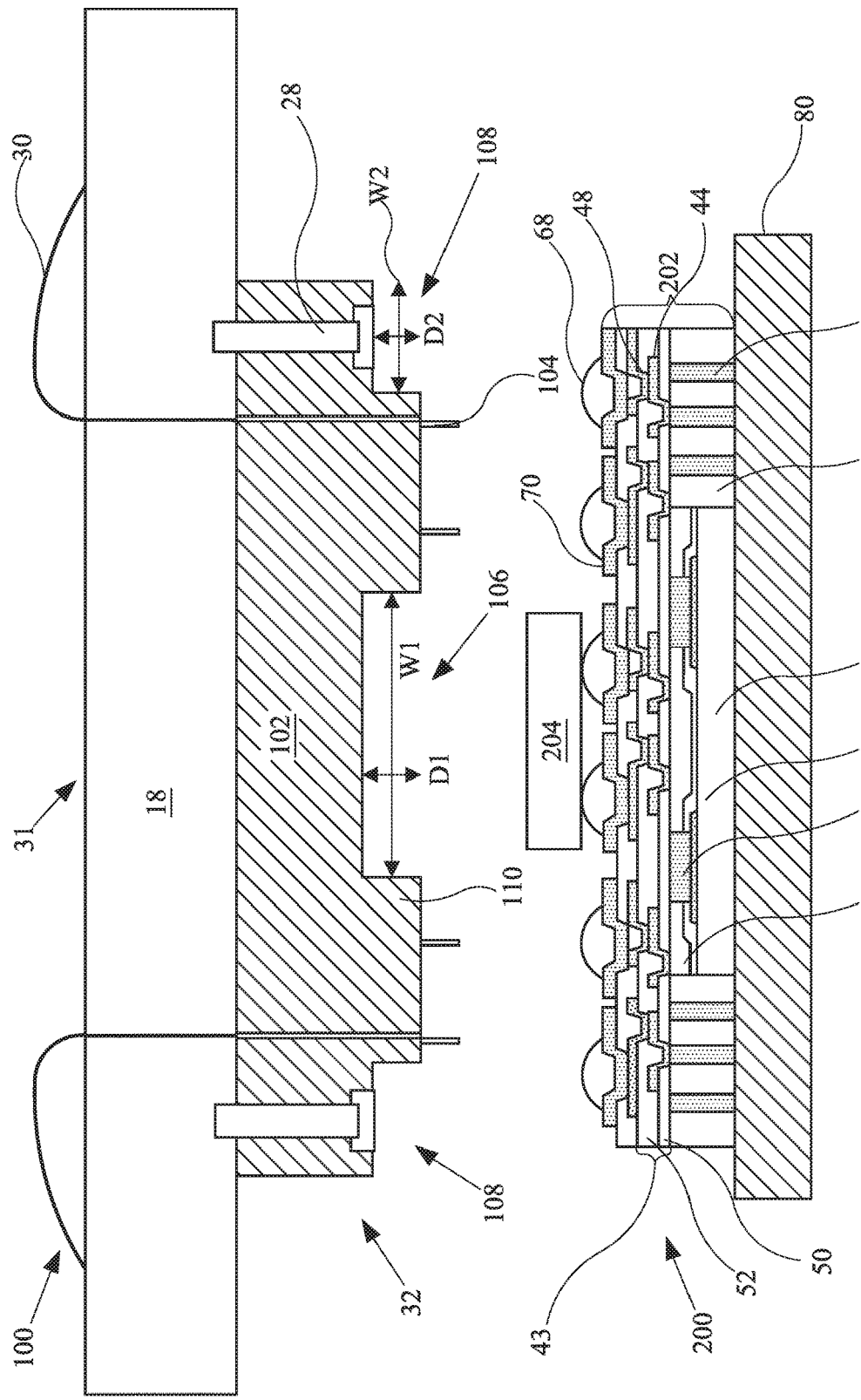
FIG. 2 is a cross sectional view of a probe head and a 3D package structure in a testing system in accordance with some embodiments.

FIG. 2 depicts a cross sectional view of probe head 32 and 3D integrated circuit package 200 to be tested using the probe testing system 100 of FIG. 1. As shown in FIG. 2, probe head 32 comprises probe head housing 102 and a plurality of probe needles 104 on a bottom surface of the probe head housing 102. Probe head housing 102 is connected to first substrate 18 by connectors 28. In some embodiments connectors 28 may be screws. Any suitable type of connector may be used. Although other details of probe test system 100 are omitted in FIG. 2, the discussion above regarding probe test system 100 is applicable to the probe head 32 and first substrate 18 depicted in FIG. 2.

As shown in FIG. 2, probe head 32 comprises a plurality of probe needles 104 that are connected to the probe head housing 102 on a protrusion 110 of probe head housing 102. During a wafer test, probe needles 104 are arranged to touch contacts on a wafer being tested, such as 3D package 200. Protrusion 110 of probe head housing 102 is arranged around an inner recess 106. As depicted in FIG. 2, package 200 comprises a bottom package component 202 and a top package component 204. A plurality of connectors 68 is disposed on an upper surface of bottom package component 202, some of which are positioned outside of the perimeter of top package component 204. Although illustrated as bumps, connectors 68 can also include pads with or without solder disposed thereon. During a test, probe head 32 is arranged over package 200 so that probe needles 104 each respectively connect to the plurality of connectors 68 that are positioned outside of the perimeter of top package component 204. Top package component 204 is positioned inside inner recess 106 during a test. Inner recess 106 may therefore be sized in a manner that is larger and/or proportional to the width, length, and height of top package component 204 so that, when probe head 32 is positioned over 3D package 200 to perform a test, top package component 204 may be positioned within inner recess 106 and damage from a physical collision between probe head housing 102 and top package component 204 can be lessened or avoided.

Names for probe head 32, probe head housing 102 and probe needles 104 are not intended to be limiting, but rather are used for illustration purpose. In some embodiments, a number of probe needles 104 match a number of connectors 68 that are positioned outside the perimeter of top package component 204. In some embodiments, a number of probe needles 104 does not match a number of connectors 68 that are positioned outside the perimeter of top package component 204. In some embodiments, the probe needles 104 are cantilever probes, POGO pins, Cobra needle probes, MEMS needle probes, wire needle probes, and/or other probes compliant with contact technologies.

In some embodiments, probe head housing 102 may comprise ceramic, engineering plastic, or silicon. In some embodiments, a plurality of openings may be formed in the probe head housing for insertion of probe needles 104. For example, in embodiments in which probe head housing 102 comprises ceramic or engineering plastic, openings may be formed in probe head housing 102 by drilling. In embodiments in which probe head housing 102 comprises silicon, openings may be etched, for example using a dry etching process.

As depicted in FIG. 2, probe head 32 may include inner recess 106. As discussed above, the size of inner recess 106 may depend on a size of top package component 204. In some embodiments, inner recess 106 may have a depth D1 of about 100 um to about 5 mm, such as about 350 um. In some embodiments, inner recess 106 may have a width W1 of about 100 um to about 30 mm, such as about 800 um. In some embodiments, inner recess 106 may have a length (in a direction that is in and out of the page in FIG. 1) of about 100 um to about 30 mm, such as about 800 um.

In some embodiments, probe head 32 may also include a perimeter recess 108. Perimeter recess 108 may extend along an outer edge of probe head housing 102. Perimeter recess 108 may define an outer edge of protrusion 110 in some embodiments. Perimeter recess 108 may have dimensions that are similar in some respects to recess 106. For example, in some embodiments, perimeter recess 108 may have a depth D2 that is the same as depth D1. For example, perimeter recess 108 may have a depth D2 of about 100 um to about 5 mm, such as about 350 um. In some embodiments, perimeter recess 108 may have a width W2 of about 200 um to about 40 mm, such as about 10 mm. In some embodiments, perimeter recess 108 may have a length (in a direction that is in and out of the page in FIG. 1) that extends along the perimeter of probe head housing 102 (See FIG. 3).

As discussed above, probe test system 100, shown in FIG. 1, is configured to perform a test on a wafer, such as 3D package 200 depicted in FIG. 2. Although the term "wafer" is used herein to describe the device being tested, other devices may be tested using the embodiments described herein, such as a die that is singulated from a wafer. During a test, probe head 32 is arranged over the device being tested, such as 3D package 200 shown in FIG. 2.

In some embodiments, 3D package 200 comprises bottom package component 202 and top package component 204. Bottom package component 202 may be any kind of suitable package component. In some embodiments, bottom package component 202 may be a fan out wafer. Any suitable methods of forming bottom package component 202 may be used.

For example, a carrier substrate (not shown) may have a buffer layer (not shown) formed thereon. Generally, the carrier substrate provides temporary mechanical and structural support during subsequent processing steps. The carrier substrate may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate is planar in order to accommodate further processing.

The buffer layer may be a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, the buffer layer is a planar layer having a uniform thickness between about 2 μm and about 6 μm. The top and the bottom surfaces of the buffer layer are planar.

Next, through vias ("TVs") 33, depicted in FIG. 2, may be formed over the buffer layer in accordance with some embodiments. The through vias 33 provide an electrical connection from one side of the package to another side of the package, as can be seen in FIG. 2. The through vias 33 may be formed, for example, by forming a conductive seed layer over the buffer layer. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like.

Next, a mask layer (not shown), such as a patterned photoresist layer, may be deposited and patterned, wherein openings in the mask layer expose the seed layer 26. The openings may be filled with a conductive material using, for example, an electroless plating process or an electrochemical plating process, thereby creating TVs 33. TVs 33 may comprise copper, aluminum, tungsten, nickel, solder, or alloys thereof. The top-view shapes of TVs 33 may be rectangles, squares, circles, or the like. The heights of TVs 33 are determined by the thickness of the subsequently placed die 34, with the height of TVs 33 being greater than the thickness of die 34 in some embodiments.

Next, the mask layer may be removed, for example in an ashing and/or wet strip process. An etch step is performed to remove the exposed portions of the seed layer, wherein the etching may be an anisotropic etching. The portions of the seed layer that are overlapped by TVs 33, on the other hand, remain not etched.

The TVs 33 can also be realized with metal wire studs placed by a wire bonding process, such as a copper wire bonding process.

Next, die 34 is attached to the backside of the buffer layer in accordance with some embodiments. In some embodiments, die 34 may be adhered to the buffer layer by an adhesive layer (not shown), such as a die-attach film (DAF). Die 34 may be a single die as illustrated in FIG. 1, or in some embodiments, two or more than two dies may be attached, and may include any die suitable for a particular approach. For example, die 34 may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. Die 34 may be attached to a suitable location for a particular design or application. For example, FIG. 1 illustrates an embodiment in which the integrated circuit die 34 is mounted in a center region wherein TVs 33 are positioned around a perimeter. In other embodiments, die 34 may be offset from a center. Before being attached to the buffer layer, die 34 may be processed according to applicable manufacturing processes to form integrated circuits (not shown) in the die 34.

Die 34 may include a substrate 35, for example comprising silicon. In some embodiments, the dies 34 include metal pillars 40 (such as copper posts) that are electrically coupled to devices such as transistors (not shown) in dies 34. In some embodiments, a dielectric layer 38 is formed at the top surface of the respective die 34, with metal pillars 40 having at least lower portions in dielectric layer 38. The top surfaces of metal pillars 40 may also be level with the top surfaces of dielectric layer 38 in some embodiments. Alternatively, dielectric layer 38 is not formed, and metal pillars 40 protrude above a top layer of die 34.

Next, molding material 42 may be molded on die 34 and TVs 33. Molding material 42 fills the gaps between die 34 and TVs 33, and may be in contact with the buffer layer. Furthermore, molding material 42 is filled into the gaps between metal pillars 40 when metal pillars 40 are protruding metal pillars. Molding material 42 may include a molding compound, a molding underfill, an epoxy, or a resin. The top surface of molding material 42 may be higher than the top ends of metal pillars 40 and TVs 33 after the molding.

Next, a grinding step is performed to thin molding material 42, until metal pillars 40 and TVs 33 are exposed. Due to the grinding, the top ends of TVs 33 are substantially level (coplanar) with the top ends of metal pillars 40, and are substantially level (coplanar) with the top surface of molding material 42. As a result of the grinding, metal residues such as metal particles may be generated, and left on the top surfaces. Accordingly, after the grinding, a cleaning may be performed, for example, through a wet etching, so that the metal residue is removed.

Next, one or more redistribution layers (RDLs) 43 are formed. Generally, RDLs provide a conductive pattern that allows a pin-out contact pattern for a completed package different than the pattern of TVs 33 and/or metal pillars 40, allowing for greater flexibility in the placement of TVs 33 and die 34. The RDLs may be utilized to provide an external electrical connection to die 34 and/or to TVs 33. The RDLs may further be used to electrically couple die 34 to TVs 33, which may be electrically coupled to one or more other packages, package substrates, components, the like, or a combination thereof. The RDLs comprise conductive lines 44 and via connections 48, wherein via connections 48 connect an overlying line (e.g., an overlying conductive lines 44) to an underlying conductive feature (e.g., TVs 33, metal pillars 40, and/or conductive lines 44).

The RDLs 43 may be formed using any suitable process. For example, in some embodiments, dielectric layer 50 is formed on the molding material 42 and die 34. In some embodiments, dielectric layer 50 is formed of a polymer, which may be a photo-sensitive material such as polybenzoxazole (PBO), polyimide, benzocyclobutene (BCB), or the like, that may be patterned using lithography. In other embodiments, dielectric layer 50 is formed of a nitride such as silicon nitride, an oxide such as silicon oxide, Phospho-Silicate Glass (PSG), BoroSilicate Glass (BSG), Boron-doped PhosphoSilicate Glass (BPSG), or the like. Dielectric layer 50 may be formed by spin coating, lamination, CVD, the like, or a combination thereof. Dielectric layer 50 is then patterned to form openings to expose metal pillars 40 and TVs 33. In embodiments in which dielectric layer 50 is formed of a photo-sensitive material, the patterning may be performed by exposing dielectric layer 50 in accordance with a desired pattern and developed to remove the unwanted material, thereby exposing metal pillars 40 and TVs 33. Other methods, such as using a patterned mask and etching, may also be used to pattern dielectric layer 50.

A seed layer (not shown) is formed over dielectric layer 50 and in the openings formed in dielectric layer 50. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern, such as the pattern illustrated in FIG. 1. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 44 and via connections 48. Dielectric layer 52 is formed over dielectric layer 50 to provide a more planar surface for subsequent layers and may be formed using similar materials and processes as used to form dielectric layer 50. In some embodiments, dielectric layer 52 is formed of polymer, a nitride, an oxide, or the like. In some embodiments, dielectric layer 52 is PBO formed by a spin-on process.

In some embodiments, additional RDLs 43 may be formed. The additional RDLs may be formed using similar processes and materials as described above with reference to other RDLs.

Next, an under bump metallization (UBM) 70 formed and patterned over an uppermost metallization pattern in accordance with some embodiments, thereby forming an electrical connection with an uppermost metallization layer, e.g., a conductive line 44 in the embodiment illustrated in FIG. 1. The UBM 70 provides an electrical connection upon which an electrical connector, e.g., a solder ball/bump, a conductive pillar, or the like, may be placed. In an embodiment, the under bump metallization 70 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 70 is formed using sputtering. In other embodiments, electro plating may be used.

Connectors 68 are formed over the under bump metallization 70 in accordance with some embodiments. The connectors 68 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 68 may include a conductive material such as solder, copper, aluminum, gold, nickel, silver, palladium, tin, the like, or a combination thereof. In some embodiments, the connectors 68 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 68 may form a grid, such as a ball grid array (BGA). In some embodiments, a reflow process may be performed, giving the connectors 68 a shape of a partial sphere in some embodiments. Alternatively, the connectors 68 may comprise other shapes. The connectors 68 may also comprise non-spherical conductive connectors, for example.

In some embodiments, the connectors 68 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Next, the carrier substrate is de-bonded from the package and the buffer layer is cleaned from the package. If a plurality of package components 202 have been formed on a wafer, the wafer is singulated into a plurality of package components 202. The resulting structure is shown in FIG. 2.

Next, top package component 204 is bonded to bottom package component 202, wherein the bonding may be through connectors 68. In some embodiments, top package component 204 includes one or more dies (not shown) bonded to a package substrate (not shown). The dies of top package component 204 may be any die suitable for a particular application. In some embodiments, top package component 204 is formed using the same or similar processes as those described above in connection with bottom package component 202. Top package component 204 may also include one or more passive devices or active devices. In other embodiments, 3D package 200 may have other configurations. For example, top package component 204 may be bonded to an opposing side of bottom package component (e.g., to TVs 33).

In some embodiments, a probe card 31 comprises first substrate 18 and probe head 32. Probe head 32, comprising probe head housing 120, may be a "hard wire type" probe card, such as probe card 31 depicted in FIG. 2. For example, in a "hard wire type" probe card, electrical signals from test head 10 (shown in FIG. 1) may be transferred to first substrate 18. In turn, electrical signals are transferred to probe needles 104 by a connector 30. As shown in FIG. 2, connector 30 may be a wire that extends from a surface of first substrate 18 to probe needles 104, passing through first substrate 18 and probe head housing 102.

Figure 3:
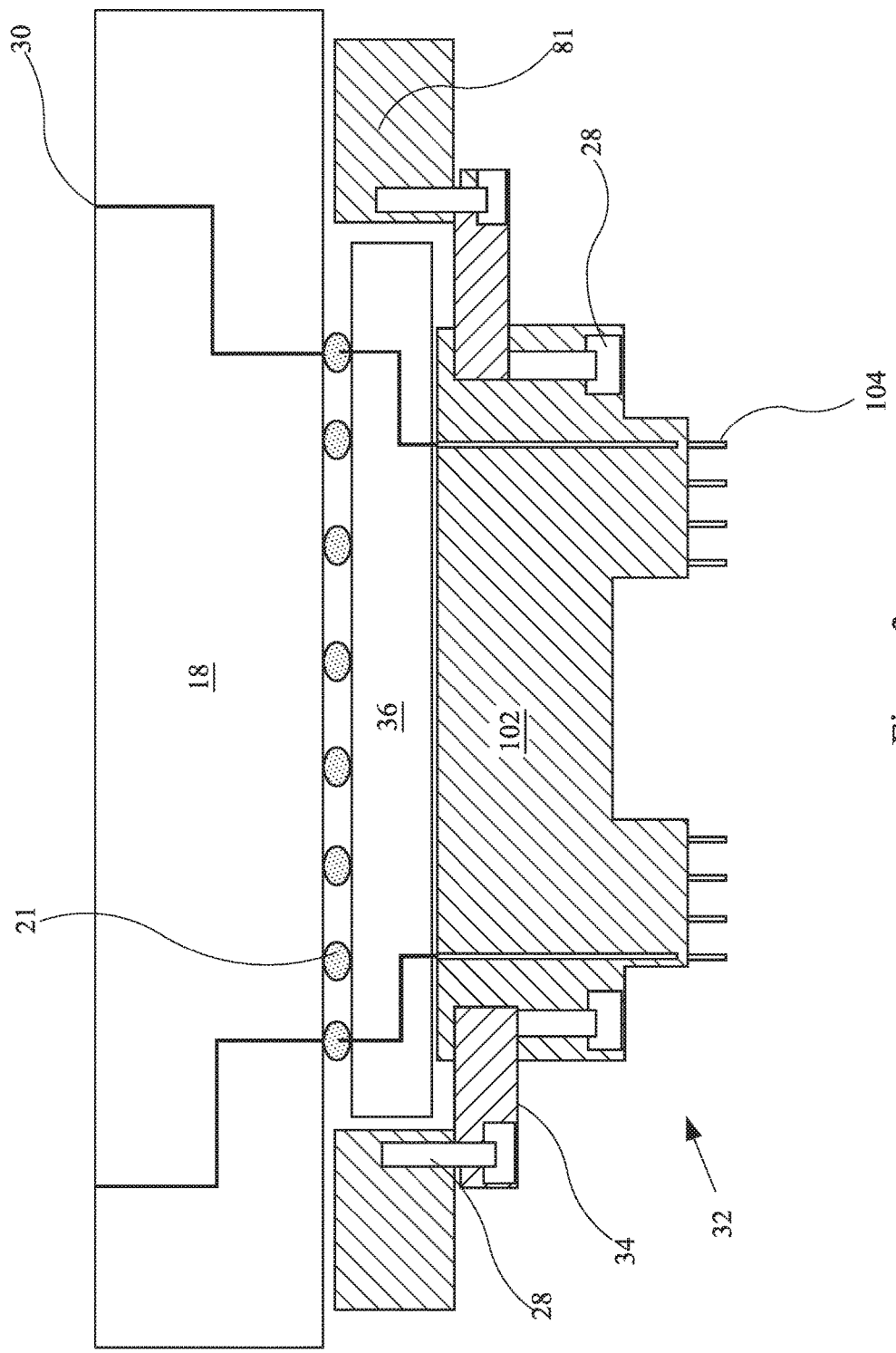
FIG. 3 is a cross sectional view of a probe head in a testing system in accordance with some embodiments.

Referring to FIG. 3, probe card 31 may also be a "multi-layer organic substrate" (MLO) type of probe card. For example, in an "MLO type" probe card, a second substrate 36 may be disposed between probe head housing 102 and first substrate 18. Second substrate 36 may be connected to first substrate 18 using connectors 21. Connectors 21 may be formed using methods that are the same as or similar to the formation of connectors 68, as described above. In some embodiments, probe head housing 102 is connected to first substrate 18. For example, as shown in FIG. 3, a connector 28 may be used to connect probe head housing 102 to a spacer 37. In some embodiments, connector 28 may be a screw. Spacer 37, in turn, may be connected to another connector 28. Connector 28 may be connected to a jig 81. First substrate 18 may be disposed over jig 81.

In an "MLO type" probe card, electrical signals from test head 10 (shown in FIG. 1) may be transferred to first substrate 18. In turn, electrical signals are transferred to probe needles 104 by a connector 30. As shown in FIG. 3, connector 30 may be a wire or other conductive feature that extends through first substrate 18, connectors 21, second substrate 36, and probe head housing 102 to probe needles 104.

Figure 4:
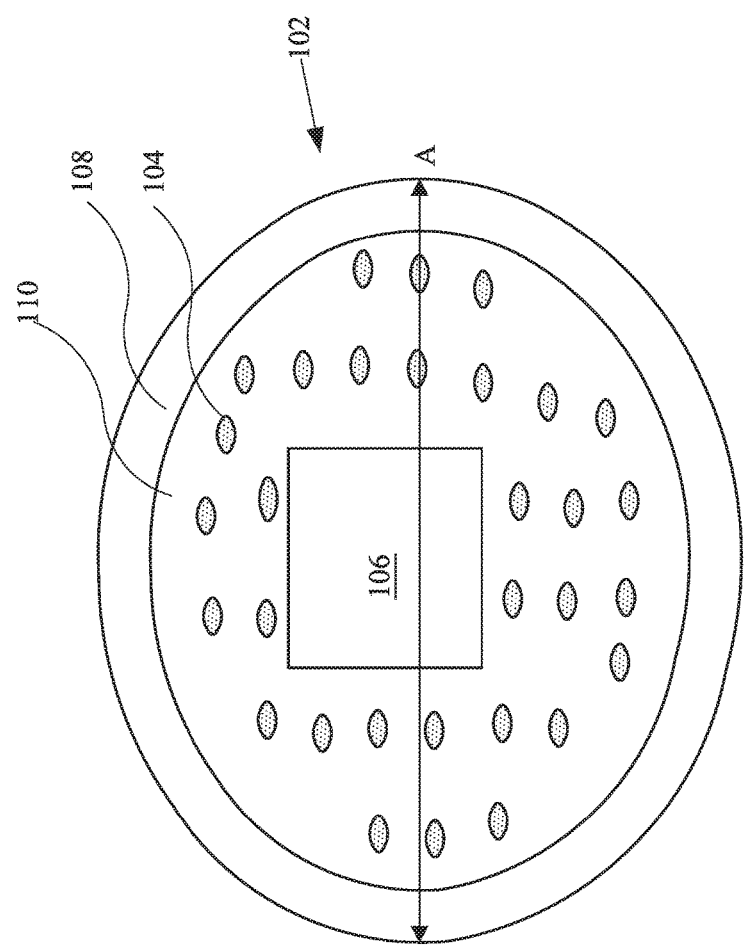
FIG. 4 is a plan view of a probe head in accordance with some embodiments.

Referring to FIG. 4, a plan view of probe head 32 is shown. In some embodiments, such as the embodiment depicted in FIG. 2, probe head 32 has a circular shape. In some embodiments, probe head 32 has a diameter A. In some embodiments, A may be about 1 cm to 15 cm, such as about 5 cm.

Probe head 32 includes a plurality of probe needles 104 arranged on protrusion 110. Although a particular number of probe needles 104 and particular positions of probe needles 104 are shown in FIG. 4, any number of probe needles 104 may be used and each probe needle 104 may be positioned in any suitable location on protrusion 110. In some embodiments, the number of probe needles 104 and the position of each probe needle 104 may depend on the number and positions of connectors 68 on the top surface of top package component 204 (shown in FIG. 2) that will be used during testing.

Protrusion 110 is arranged around inner recess 106, and perimeter recess 108 is arranged around protrusion 110. In some embodiments, inner recess 106 may be positioned in the center of protrusion 110, as depicted in FIG. 2. In some embodiments inner recess 106 may be positioned in a different location of protrusion 110. In some embodiments, inner recess 106 may have a shape and dimensions that correspond to the shape and dimensions of top package component 204 (shown in FIG. 1). For example, in the embodiment depicted in FIG. 2, inner recess 106 has a rectangular shape. Other shapes are possible.

Figure 5:
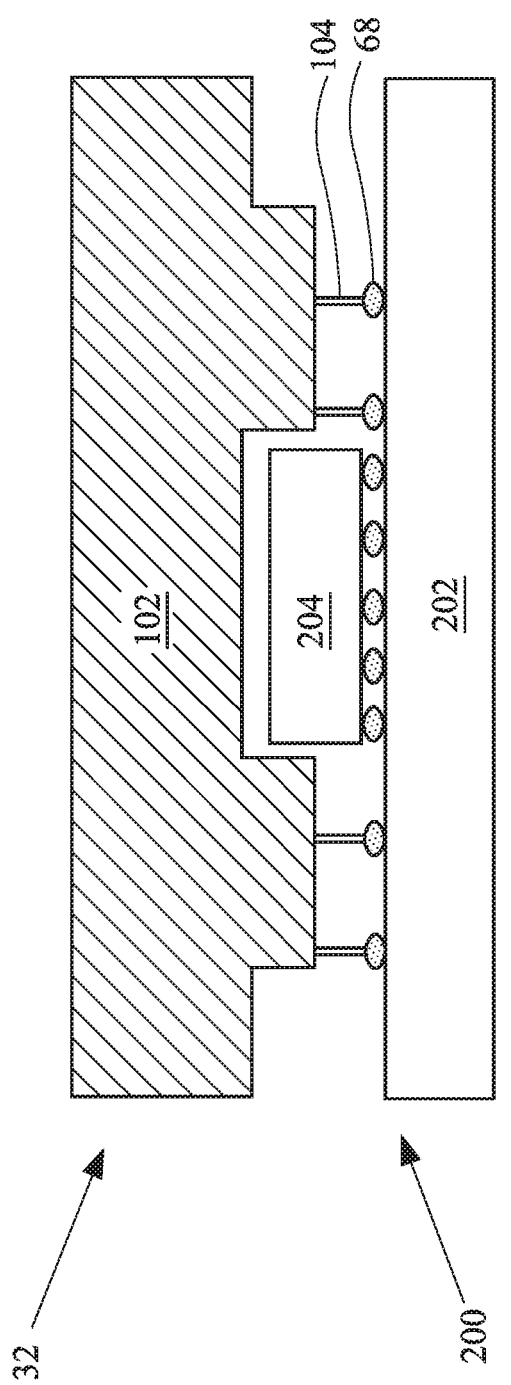
FIG. 5 is a cross sectional view of a probe head and a 3D package structure in accordance with some embodiments.

FIG. 5 depicts probe head 32 being arranged to conduct a test of 3D package 200. In FIG. 5, probe head 32 is arranged over 3D package 200 for a wafer test. In a wafer test, probe needles 104 physically touch corresponding connectors 68 of 3D package 200. Probe head 32 is connected to a test head 10 (shown in FIG. 1) that generates control signals, data signals, clock signals, and/or power signals. The control signals, data signals, clock signals and/or power signals are transmitted to the probe needles 104, which in turn transmit the signals to the corresponding connectors 68.

In FIGS. 5 and 7-9, the 3D packages depicted are illustrated in a simplified manner. The embodiment of 3D package 200 depicted in FIG. 2, and the discussion herein relating to 3D package 200 as depicted in FIG. 2, is applicable to each of the 3D packages depicted in FIGS. 5 and 7-9.

Figure 6:
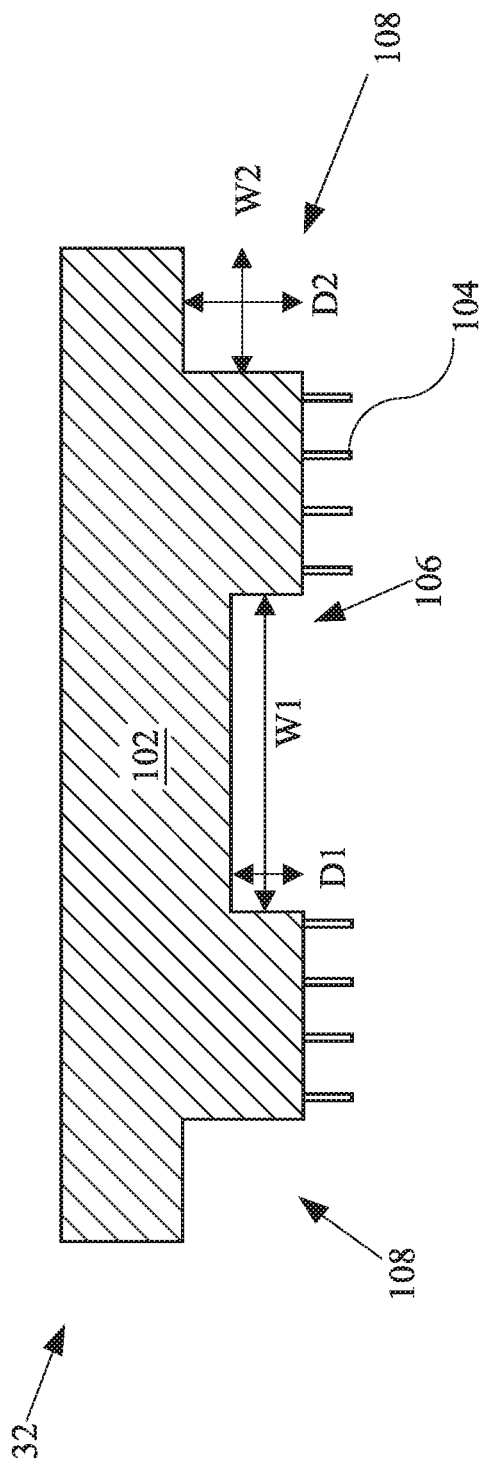
FIG. 6 is a cross sectional view of a probe head in accordance with some embodiments.

Other embodiments of probe head 32 are possible. FIG. 6 depicts a cross sectional view of an embodiment of probe head 32. Probe head housing 102 of probe head 32 includes an inner recess 106, which has dimensions similar to the dimensions of inner recess 106 depicted in FIG. 1, discussed above. In some embodiments, inner recess 106 may have a depth D1 of about 100 um to about 20 mm, such as about 500 um. In some embodiments, inner recess 106 may have a width W1 of about 200 um to about 50 mm, such as about 10 mm.

In some embodiments, such as the embodiment depicted in FIG. 6, perimeter recess 108 may have dimensions that are different from the dimensions of inner recess 106. In some embodiments, perimeter recess 108 may have a depth D2 of about 100 um to about 20 mm, such as about 500 um. In some embodiments, perimeter recess 108 may have a width W2 of about 200 um to about 50 mm, such as about 10 mm.

Figure 7:
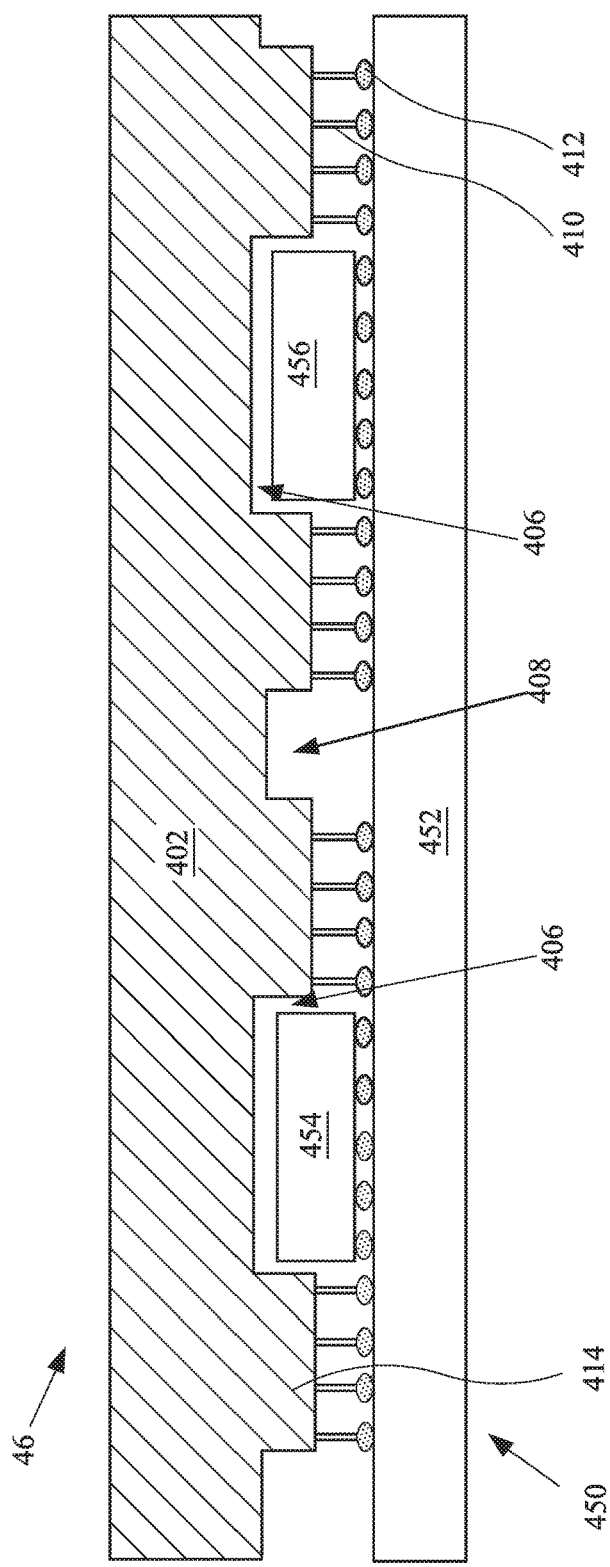
FIG. 7 is a cross sectional view of a probe head and a 3D package structure in accordance with some embodiments.

Referring to FIG. 7, a cross sectional view of an embodiment of probe head 46 and 3D package structure 450 is depicted. In FIG. 7, probe head 46 is arranged to conduct a test of package structure 450.

Package structure 450 includes a bottom package 452. A first top package 454 and a second top package 456 are bonded to a top surface of bottom package 452. Bottom package 452, first top package 454 and second top package 456 may include any type of packages or devices that are suitable for a particular application.

In some embodiments, probe head housing 402 may include a plurality protrusions 414 positioned around a plurality of inner recesses 406. For example, probe head housing 402 may include two protrusions 414 positioned around two inner recesses 406, such as the embodiment depicted in FIG. 2. Although two protrusions 414 and two inner recesses 406 are shown in FIG. 2, more protrusions 414 and inner recesses 406 may be formed in probe head housing 402. For example, in some embodiments the number of protrusions 414 and inner recesses 406 may be determined by the number of top packages 454 and 456 that are bonded to bottom package 452.

In some embodiments, the dimensions of inner recesses 406 may be dependent upon the dimensions of first top package 454 and second top package 456. In some embodiments, of first top package 454 may have dimensions that are the same or similar to the dimensions of second top package 456. As such, the dimensions of inner recesses 406 may also be the same or similar. An example of such an embodiment is depicted in FIG. 7.

Each of the protrusions 414 of probe head housing 402 includes a plurality of probe needles 410. When probe head 46 is arranged as depicted in FIG. 5 to conduct a test of 3D package 450, probe head 46 is positioned over 3D package 450 such that the plurality of probe needles 410 on each of the two protrusions contacts the plurality of contacts 412 on the top surface of bottom package 452. Further, when probe head 46 is arranged to conduct a test of 3D package 250, first top package 454 and top package 456 are respectively positioned in an inner recess 406. Due to the inner recesses 406, probe head housing 402 may be positioned to allow the plurality of probe needles 410 to touch the plurality of contacts 412 without physically damaging first top package 454, second top package 456 or probe head housing 402.

Figure 8:
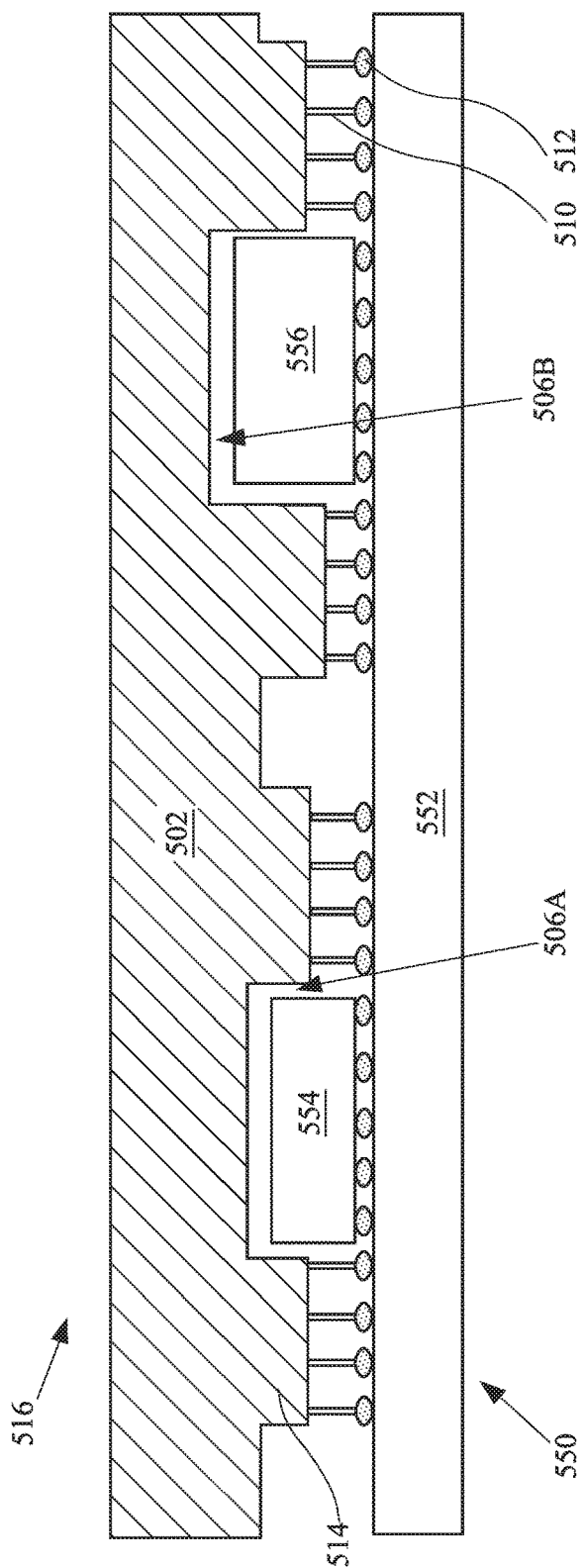
FIG. 8 is a cross sectional view of a probe head and a 3D package structure in accordance with some embodiments.

Referring to FIG. 8, a cross sectional view of an embodiment of probe head 516 and 3D package structure 550 is depicted. Probe head 516 is arranged to conduct a test of 3D package structure 550. 3D package structure may include a bottom package component 552, and a first top package component 554 and a second top package component 556 bonded to a top surface of bottom package component 552. When probe head 516 is arranged to conduct a test of 3D package structure 550, probe head housing 502 is arranged over 3D package structure 550 such that probe needles 510 on probe head 516 touch contacts 512 on a top surface of bottom package component 552. Further, when probe head 516 is arranged to conduct a test of 3D package structure 550, first top package component 554 is positioned in inner recess 506A and second top package component 556 is positioned in inner recess 506B.

In some embodiments, for example as depicted in FIG. 8, first inner recess 506A may have dimensions that are different than second inner recess 506B. For example, in some embodiments, first top package component 554 may have dimensions that are different than the dimensions of second top package component 556. Inner recesses 506, which may have dimensions that are dependent upon (and/or designed to accommodate) first top package component 554 and second top package component 556, may also have dimensions that are different from each other. Although different depths are shown in FIG. 6, in some embodiments inner recesses may have different depths, widths, and/or lengths. As such, when probe head 516 is arranged to test 3D packaged structure 550, first top package component 554 is positioned in inner recess 506A and second top package component 556 is positioned in inner recess 506B. In some embodiments, the different dimensions of inner recess 506A and inner recess 506B may allow different dimensions of top packages to be bonded to bottom package component 552 and tested by probe head 516 without damaging the top package components or probe head housing 502.

Figure 9:
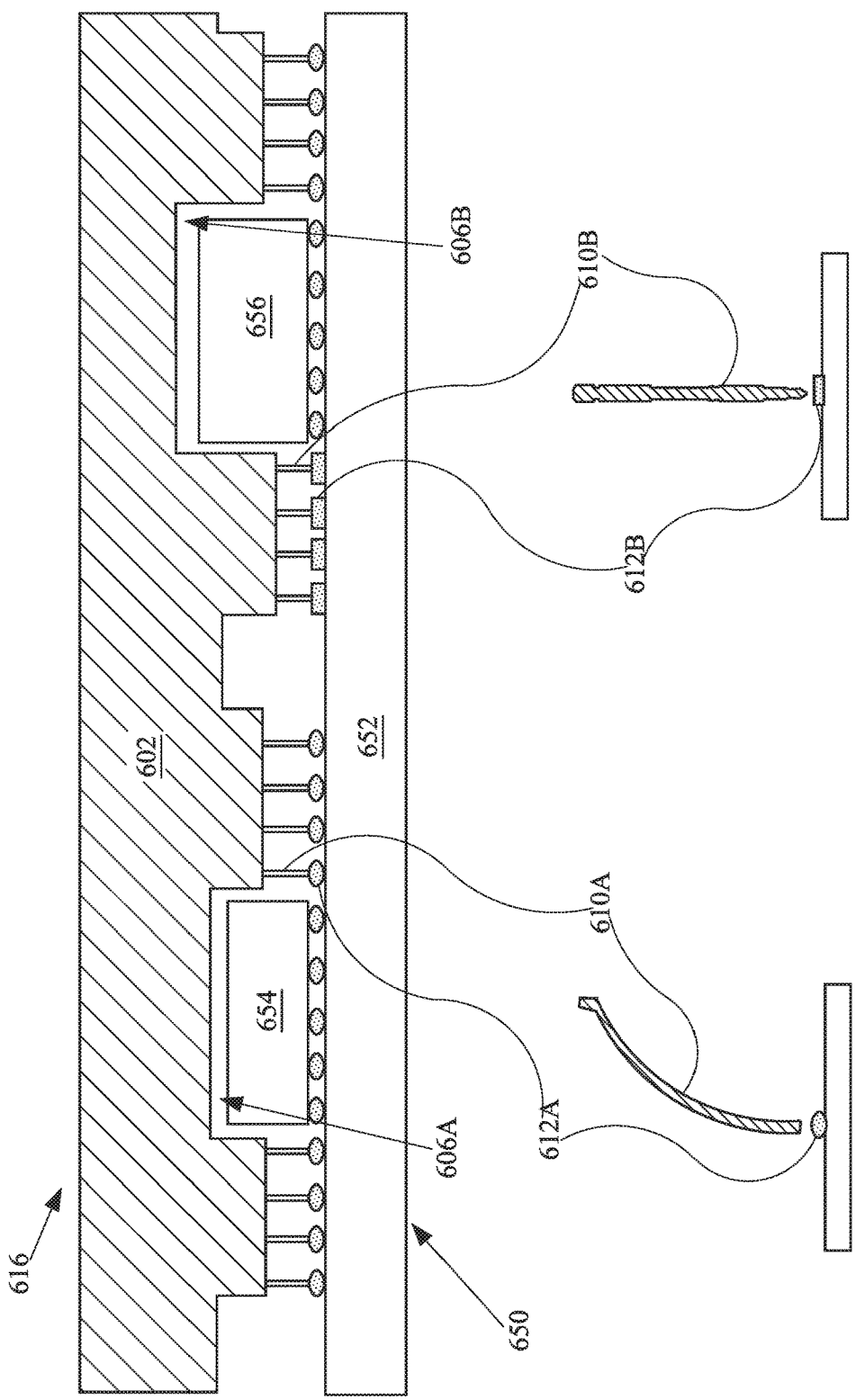
FIG. 9 is a cross sectional view of a probe head and a 3D package structure in accordance with some embodiments.

Referring to FIG. 9, a cross sectional view of an embodiment of probe head 616 and 3D package structure 650 is depicted. Probe head 616 is arranged to conduct a test of 3D package structure 650. 3D package structure may include a bottom package component 652, and a first top package component 654 and a second top package component 656 bonded to a top surface of bottom package component 652. When probe head 616 is arranged to conduct a test of 3D package structure 650, probe head housing 602 is arranged over 3D package structure 650 such that probe needles 610 on probe head housing 602 touch contacts 612 on a top surface of bottom package component 652. Further, when probe head 616 is arranged to conduct a test of 3D package structure 650, first top package component 654 is positioned in inner recess 606A and second top package component 556 is positioned in inner recess 606B.

In some embodiments, contacts 612 on a top surface of bottom package component 652 include different types of contacts 612. FIG. 9 depicts a plurality of contact bumps 612A and a plurality of contact pads 612B, although any type of contact that is suitable for a particular application may be used.

In some embodiments, probe needles 610 may include different types of probe needles. For example, probe needles 610 may include cantilever probes, POGO pins, Cobra needle probes, MEMS needle probes, wire needle probes, and/or other probes compliant with contact technologies. As shown in FIG. 7, multiple types of probe needles may be included in a single probe head 616.

In some embodiments, the type of probe needle 610 may be selected depending on the types of contacts 612 that are present on the top surface of bottom package component 652. For example, cobra needles 610A with a flat tip may be suitable for touching bump contacts 611A. As another example, pogo pins 610B with a pointed tip may be suitable for touching pad contacts 612B. As such, if the top surface includes both bump contacts 612A and pad contacts 612B, then probe head 616 may include both cobra needles 610A and pogo pins 610B. In some embodiments, a number of cobra needles 610A matches a number of bump contacts 612A, and a number of pogo pins 610B matches a number of pad contacts 612B. In some embodiments, the positions of cobra needles 610A matches the positions of bump contacts 612A when probe head 616 is arranged to test 3D package structure 650, and the positions of pogo pins 610B matches the positions of pad contacts 612B when probe head 616 is arranged to test 3D package structure 650.

Figure 10:
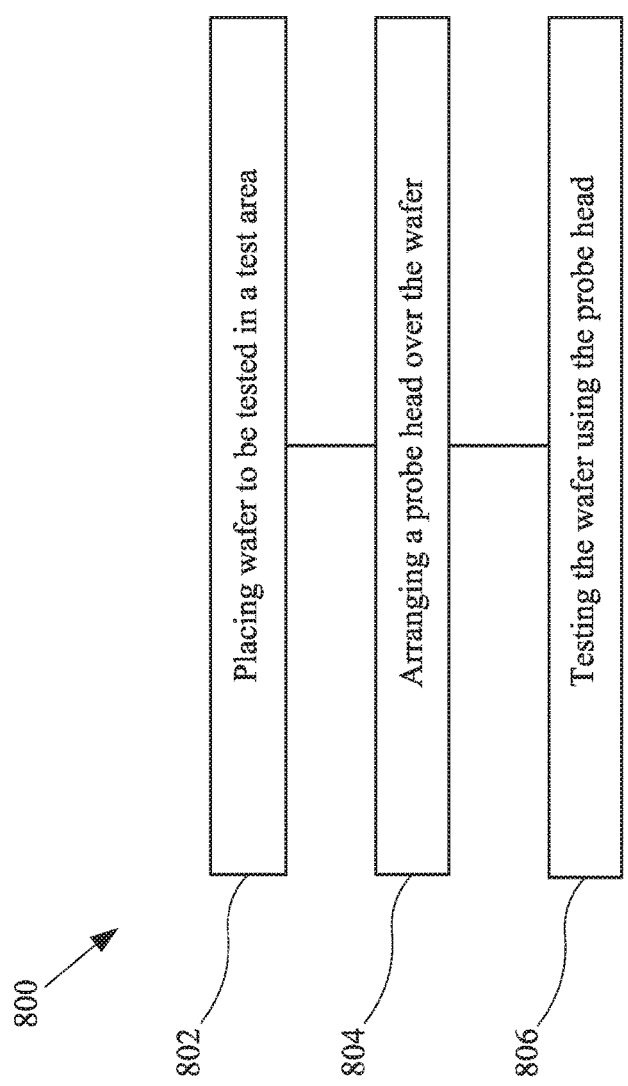
FIG. 10 is a flow chart of a method of testing a wafer using a probe head in accordance with some embodiments.

Referring to FIG. 10, a method of testing a wafer is depicted. In step 802, a wafer to be tested in placed in a test area (e.g. on chuck 20, FIG. 1). In step 804, a probe head is arranged over the wafer to be tested. In step 806, the wafer is tested using the probe head.

As described herein, a probe head housing may include an inner recess so that, when the probe head is arranged over a device being tested, a top component may be positioned within the inner recess. In some embodiments, the inner recess may allow probe needles on the probe head to connect to contacts on a surface of the device being tested, thereby avoiding or reducing damage caused by the top component physically contacting the probe head.

An embodiment provides a probe head. The probe head includes a first end connected to a first substrate, the first substrate configured to be connected to a test head. A second end of the probe head includes a first inner recess surrounded by a first protrusion, and a first plurality of probe needles that are connected to the first protrusion.

Another embodiment provides a method. The method includes placing a wafer to be tested in a test area. The wafer includes a top substrate bonded to a bottom substrate. The method also includes arranging a probe head over the wafer. The probe head includes first end connected to a tester. The probe head also includes a second end having a first protrusion arranged around a first inner recess and a first plurality of probe needles connected to the first protrusion. The probe head is arranged in a manner that the first plurality of probe needles each respectively touch a contact on a surface of the wafer, and the top substrate is positioned in the first inner recess.

Another embodiment provides a method. The method includes placing a wafer to be tested in a test area. The wafer including a first top substrate and a second top substrate. The first top substrate and the second top substrate are bonded to a bottom substrate. The method also includes arranging a probe head over the wafer. The probe head includes a first end connected to a tester. A second end of the probe head includes a first protrusion arranged around a first inner recess and a first plurality of probe needles connected to the first protrusion. The second end also includes a second protrusion arranged around a second inner recess and a second plurality of probe needles connected to the second protrusion. The probe head is arranged in a manner that the first plurality of probe needles each respectively touch a contact on a surface of the wafer, the second plurality of probe needles each respectively touch a contact on the surface of the wafer, the first top substrate is positioned in the first inner recess, and the second top substrate is positioned in the second inner recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe head, comprising:
   a first end connected to a first surface of a first substrate, the first substrate configured to be connected to a test head;
   a second end comprising:
     a first inner recess surrounded by a first protrusion, the first protrusion having a second surface, the first surface of the first substrate and the second surface of the first protrusion facing in a same direction; and
     a first plurality of probe needles connected to the first protrusion, the first plurality of probe needles physically contacting the second surface of the first protrusion; and a plurality of connectors extending through the first substrate and the first protrusion, the plurality of connectors being electrically coupled to the first plurality of probe needles.

2. The probe head of claim 1, wherein the probe head has a circular shape and the first protrusion is ring-shaped.

3. The probe head of claim 1, wherein the probe head is configured to test a package comprising a top substrate bonded to a bottom substrate, and wherein the first inner recess has a size that allows the top substrate to be positioned inside the first inner recess.

4. The probe head of claim 1, wherein the second end further comprises:
a second inner recess surrounded by a second protrusion; and
a second plurality of probe needles connected to the second protrusion.

5. The probe head of claim 4, wherein the first plurality of probe needles and the second plurality of probe needles are probe needles of a single type.

6. The probe head of claim 4, wherein the first plurality of probe needles and the second plurality of probe needles include probe needles of two or more types.

7. The probe head of claim 4, wherein the first inner recess has a same depth as the second inner recess, wherein depth is measured in a direction that is parallel to an axis of a probe needle of the first plurality of probe needles.

8. The probe head of claim 4, wherein the probe head is comprised within a multi-layer organic substrate-type probe card.

9. The probe head of claim 1, wherein the probe head is comprised within a hard wired-type probe card.

10. A method, comprising:
placing a wafer to be tested in a test area, the wafer including a top substrate bonded to a bottom substrate; and
arranging a probe head over the wafer, the probe head comprising:
a first end connected to a tester;
a second end having a first protrusion arranged around a first inner recess and a first plurality of probe needles connected to the first protrusion; and
wherein the probe head is arranged in a manner that the first plurality of probe needles each respectively touch a contact on a surface of the wafer, the top substrate is positioned in the first inner recess, and at least a portion of a sidewall of the top substrate faces a sidewall of the first inner recess.

11. The method of claim 10, further comprising testing the wafer by transmitting signals from the tester to the wafer through the first plurality of probe needles.

12. The method of claim 10, wherein the first protrusion is ring-shaped.

13. The method of claim 10, wherein the first plurality of probe needles are probe needles of a single type, and wherein the single type of probe needles is selected from the group consisting of: pogo pins, cobra needles, wire needles, and Micro-Electro-Mechanical Systems (MEMS) needles.

14. The method of claim 10, wherein the first plurality of probe needles includes probe needles of two or more different types.

15. A method, comprising:
placing a wafer to be tested in a test area, the wafer including a first die structure, a second die structure and a third die structure, the first die structure and the second die structure being bonded to the third die structure; and
arranging a probe head over the wafer, the probe head comprising:
a first end connected to a tester; and
a second end comprising:
a first protrusion arranged around a first inner recess and a first plurality of probe needles connected to the first protrusion; and
a second protrusion arranged around a second inner recess and a second plurality of probe needles connected to the second protrusion;
wherein the probe head is arranged in a manner that the first plurality of probe needles each respectively touch a contact on a surface of the third die structure, the second plurality of probe needles each respectively touch a contact on the surface of the third die structure, the first die structure is positioned in the first inner recess, and the second die structure is positioned in the second inner recess.

16. The method of claim 15, further comprising testing the wafer by transmitting signals from the tester to the wafer through the first plurality of probe needles.

17. The method of claim 15, wherein the first inner recess has a different depth as the second inner recess, wherein depth is measured in a direction that is parallel to an axis of a probe needle of the first plurality of probe needles.

18. The method of claim 15, wherein the first inner recess is a different size than the second inner recess.

19. The method of claim 18, wherein the first die structure is a different size than the second die structure.

20. The method of claim 15, wherein the first plurality of probe needles touch contacts on the third die structure having a first type, the second plurality of probe needles touch contacts on the third die structure having a second type, and wherein the first type and the second type are different.

* * * * *